United States Patent
Kodama

(10) Patent No.: US 7,006,396 B2
(45) Date of Patent: Feb. 28, 2006

(54) SEMICONDUCTOR MEMORY DEVICE AND PRECHARGE CONTROL METHOD

(75) Inventor: Tsuyoshi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/943,002

(22) Filed: Sep. 17, 2004

(65) Prior Publication Data

US 2005/0213404 A1    Sep. 29, 2005

(30) Foreign Application Priority Data

Mar. 25, 2004   (JP)   .............................. 2004-089548

(51) Int. Cl.
*G11C 7/00*    (2006.01)

(52) U.S. Cl. ........................................ 365/203; 365/63
(58) Field of Classification Search ................ 365/203, 365/63
See application file for complete search history.

(56) References Cited

U.S. PATENT DOCUMENTS

| 5,717,625 A | * | 2/1998 | Hasegawa et al. ............. 365/49 |
| 5,894,442 A | | 4/1999 | Okamura ..................... 365/203 |
| 6,515,913 B1 | * | 2/2003 | Kajigaya et al. ........ 365/189.02 |

FOREIGN PATENT DOCUMENTS

| JP | 08-063971 | 3/1996 |
| JP | 09-231758 | 9/1997 |

* cited by examiner

Primary Examiner—Michael Tran
(74) Attorney, Agent, or Firm—Arent Fox, PLLC

(57) ABSTRACT

A semiconductor memory device that quickly precharges a bit line and shortens the cycle time for accessing the memory cells. The semiconductor memory device includes a memory cell array having a plurality of memory cells. A bit line is connected to the plurality of memory cells. A plurality of precharge circuits are connected to the bit line to precharge the bit line to a predetermined potential. A timing control circuit generates a timing signal. The precharge control circuit controls the precharge circuits in response to the timing signal such that the precharge circuits are activated sequentially from the one farthest from the timing control circuit to the one closest to the timing control circuit.

14 Claims, 8 Drawing Sheets

SEMICONDUCTOR MEMORY DEVICE AND PRECHARGE CONTROL METHOD

CROSS-REFERENCE TO RELATED APPLICATIONS

This application is based upon and claims the benefit of priority from prior Japanese Patent Application No. 2004-089548, filed on Mar. 25, 2004, the entire contents of which are incorporated herein by reference.

BACKGROUND OF THE INVENTION

The present invention relates to a semiconductor memory device and a precharge control method for precharging bit lines in a semiconductor memory device, and more particularly, to a semiconductor memory device having a plurality of precharge circuits for precharging bit lines.

Semiconductor memory devices read data from or write data into memory cells via bit lines. Following completion of such access operation, the semiconductor memory devices precharge the bit lines to a predetermined potential (precharge operation). For these semiconductor memory devices, a technique is required to increase the speed for precharging the bit lines and shortening the cycle time for accessing the memory cells.

Japanese Laid-Open Patent Publication 9-231758 describes an example of a semiconductor memory device having precharge circuits provided respectively for memory cell groups and a control circuit controlling the precharge circuits. The semiconductor memory device quickly precharges bit lines with the precharge circuits.

FIG. 1 is a schematic block diagram showing a conventional semiconductor memory device 1.

The semiconductor memory device 1 has a memory cell array 11. The memory cell array 11 is formed by rows and columns of memory cells 12 (in FIG. 1, the memory cells 12 arranged in the direction of the rows are not shown). The semiconductor memory device 1 has a plurality of bit line pairs, each bit line pair being connected to one of the columns of the memory cells 12 (in FIG. 1, only one bit line pair Bit/XBit is shown). The semiconductor memory device 1 further has a plurality of precharge/equalization circuits 14L, 14M, and 14U and a sense amplifier 15 which are connected to each bit line pair.

The semiconductor memory device 1 also has a timing control circuit 16. The timing control circuit 16 controls the timing for accessing the memory cells 12 in accordance with an input signal such as a clock signal CK, an address signal AD, or a control signal CNT. The timing control circuit 16 includes a precharge/equalization control circuit 16a for generating a precharge/equalization signal EQ.

The precharge/equalization circuits 14L, 14M, and 14U are respectively located at three different positions in the memory cell array 11, a closest position, a middle position, and a farthest position from the sense amplifier 15. The precharge/equalization circuits 14L, 14M, and 14U precharge the bit lines Bit and XBit to a predetermined potential in response to the precharge/equalization signal EQ provided from the precharge/equalization control circuit 16a.

The operation of the semiconductor memory device 1 shown in FIG. 1 will now be described. The operation for reading data from the memory cell 12U located at the farthest position from the sense amplifier 15 will be described.

As shown in FIG. 2, when a clock signal CK is input to the timing control circuit 16 to start the read operation, data in the memory cell 12U is output to the bit line Bit. The data is transmitted to the sense amplifier 15 via an upper portion (U), a middle portion (M), and a lower portion (L) of the bit line Bit. The sense amplifier 15 amplifies the data transmitted to the lower portion (L) of the bit line Bit so that the data can be read. When a predetermined delay time elapses after the completion of the operation at the lower portion (L) of the bit line Bit that is close to the sense amplifier 15, the precharge/equalization control circuit 16a provides the precharge/equalization signal EQ to the precharge/equalization circuits 14L, 14M, and 14U. The precharge/equalization circuit 14L, 14M, and 14U respectively precharges the bit lines Bit and XBit in response to the precharge/equalization signal EQ.

Japanese Laid-Open Patent Publication 8-63971 describes another example of a semiconductor memory device having a sense amplifier and a precharge circuit located on opposite side of a memory cell array from the sense amplifier. In this semiconductor memory device, a signal generation circuit located close to the sense amplifier provides a precharge signal to the precharge circuit.

SUMMARY OF THE INVENTION

In the conventional semiconductor memory device 1 shown in FIGS. 1 and 2, the precharge/equalization signal EQ is transmitted sequentially via signal lines from the precharge/equalization circuits 14L, which is close to the timing control circuit 16 (sense amplifier 15), to the precharge/equalization circuit 14U, which is far from the timing control circuit 16. After the potential at the lower portion (L) of the bit line Bit drops to a level at which reading of data is enabled, the precharge/equalization control circuit 16a outputs a precharge/equalization signal EQ. The precharge/equalization circuits 14L, 14M and 14U start precharging the bit line Bit in response to the precharge/equalization signal EQ. Therefore, the upper portion (U) of the bit line Bit is precharged later than the lower portion (L) of the bit line Bit. Hence, the next read operation is enabled only after the completion of precharge of the upper portion (U) of the bit line Bit. This prolongs the cycle time tCY of the read operation. Although the above description concerns the read operation, a similar problem occurs when performing a write operation due to the delay of the timing for precharging the upper portion (U) of the bit line.

Japanese Laid-Open Patent Publication 8-63971 does not describe a technique for precharging bit lines at a high speed with a plurality of precharge circuits.

The present invention provides a semiconductor memory device and a precharge control method for quickly precharge bit lines and shortening the cycle time for accessing memory cells.

One aspect of the present invention is a semiconductor memory device provided with a memory cell array including a plurality of memory cells. A bit line is connected to the memory cells. A plurality of precharge circuits connected to the bit line precharges the bit line to a predetermined potential. A timing control circuit generates a timing signal to access each of the memory cells. A precharge control circuit, connected to the timing control circuit and the precharge circuits, controls the plurality of precharge circuits in response to the timing signal such that the precharge circuits are sequentially activated from the one that is farthest from the timing control circuit to the one that is closest to the timing control circuit.

Another aspect of the present invention is a semiconductor memory device provided with a memory cell array having a plurality of blocks, each including a plurality of memory cells. A local bit line is connected to the memory cells in each of the blocks. A global bit line is connected to the blocks. A plurality of precharge circuits connected to the global bit line precharges the global bit line to a predetermined potential. A timing control circuit generates a timing signal to access each of the memory cells. A precharge control circuit, connected to the timing control circuit and the precharge circuits, controls the precharge circuits in response to the timing signal such that the precharge circuits are sequentially activated from the one that is farthest from the timing control circuit to the one that is closest to the timing control circuit.

A further aspect of the present invention is a semiconductor memory device provided with a memory cell array including a plurality of memory cells, each storing data. A bit line is connected to the memory cells. A sense amplifier connected to the bit line reads data from each of the memory cells through the bit line. A plurality of precharge circuits connected to the bit line precharges the bit line to a predetermined potential. A precharge control circuit, connected to the precharge circuits, controls the precharge circuits such that the precharge circuits are sequentially activated from the one that is farthest from the sense amplifier to the one that is closest to the sense amplifier.

Another aspect of the present invention is a method for precharging a bit line connected to a plurality of memory cells in a semiconductor memory device. The semiconductor memory device includes a timing control circuit and a plurality of precharge circuits, connected to the bit line, for precharging the bit line to a predetermined potential. The method includes generating a timing signal for accessing each of the memory cells with the timing control circuit, and controlling the precharge circuits in response to the timing signal such that the precharge circuits are sequentially activated from the one that is farthest from the timing control circuit to the one that is closest to the timing control circuit.

A further aspect of the present invention is a method for precharging a bit line connected to a plurality of memory cells in a semiconductor memory device. The semiconductor memory device includes a plurality of precharge circuits, connected to the bit line, for precharging the bit line to a predetermined potential and a sense amplifier, connected to the bit line, for reading data from each of the memory cells through the bit line. The method includes generating a timing signal for accessing each of the memory cells, and controlling the precharge circuits in response to the timing signal such that the precharge circuits are activated sequentially from the one that is farthest from the sense amplifier to the one that is closest to the sense amplifier.

Another aspect of the present invention is method for precharging a bit line connected to a memory cell in a semiconductor memory device. The semiconductor memory device includes a plurality of precharge circuits, connected to the bit line, for precharging the bit line to a predetermined potential and a sense amplifier, connected to the bit line, for reading data from the memory cell through the bit line. The method includes generating a timing signal for accessing each of the memory cells, starting reading of data from the memory cell with the sense amplifier, receiving a timing signal, generating a precharge signal for activating the precharge circuits when a predetermined time elapses after receiving the timing signal, and transmitting the precharge signal to the precharge circuits sequentially from the one farthest from the sense amplifier to the one closest to the sense amplifier. The predetermined time is set such that the precharge signal reaches the precharge circuit closest to the sense amplifier after the completion of reading data from the memory cell.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS (First Embodiment)

A static RAM (SRAM) 10 serving as a semiconductor memory device according to a first embodiment of the present invention will now be described with reference to the drawings.

Figure 3:
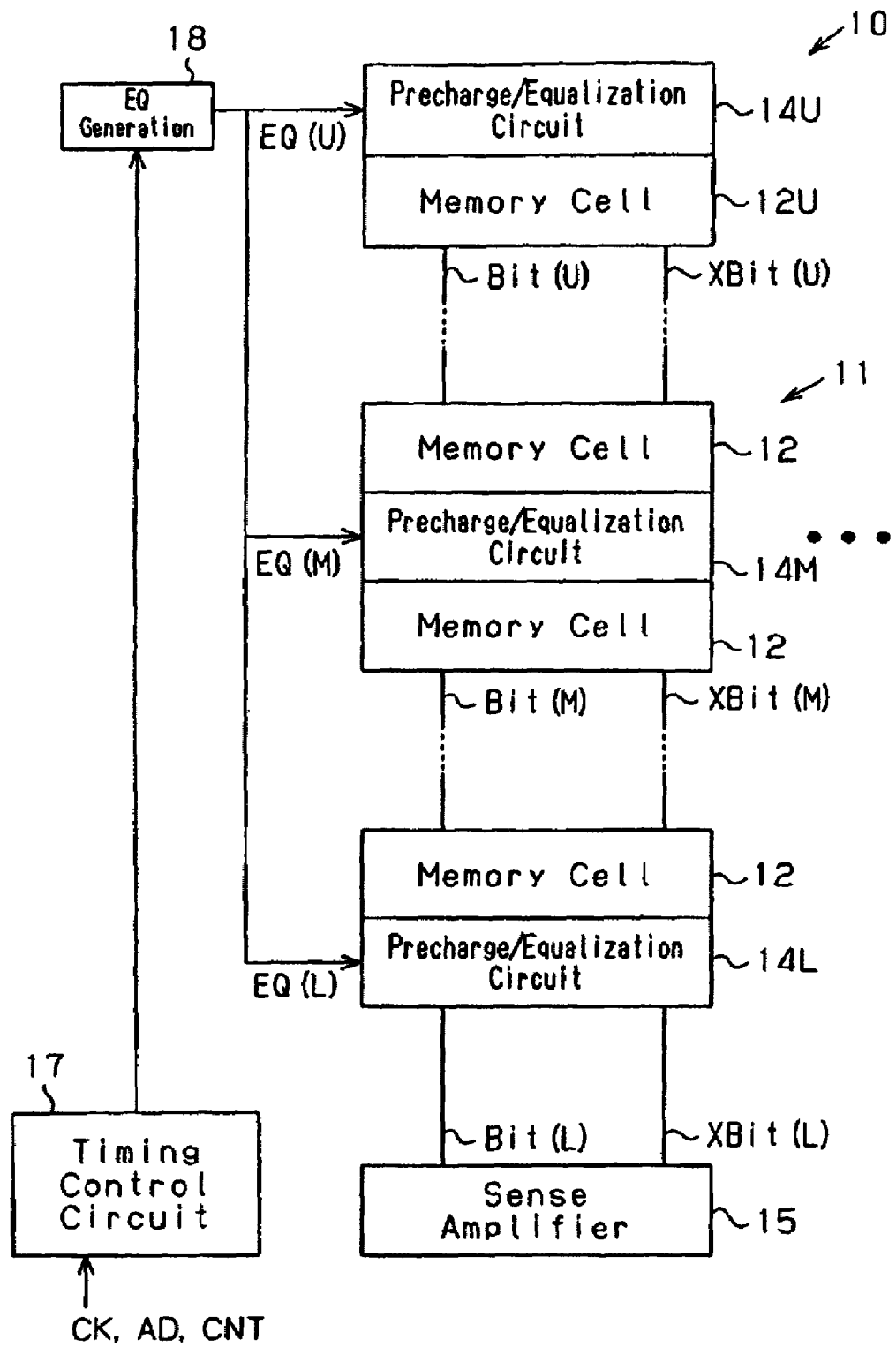
FIG. 3 is a schematic block diagram showing an SRAM according to a first embodiment of the present invention.

FIG. 3 is a schematic block diagram showing the SRAM 10 of the first embodiment.

The SRAM 10 has a memory cell array 11. The memory cell array 11 is formed by rows and columns of memory cells 12. In FIG. 3, the memory cells 12 arranged in the direction of the rows are not shown.

The SRAM 10 has a plurality of bit line pairs respectively connected to a plurality of columns of the memory cells 12 (in FIG. 3, only one bit line pair Bit/XBit is shown). A plurality of precharge/equalization circuits 14 (14L, 14M and 14U) and a sense amplifier 15 are connected to the bit line pair Bit/XBit. In the SRAM 10 of the first embodiment, the precharge/equalization circuits 14 are located at three different positions in the memory cell array 11, a closest position, a middle position, and a farthest position from the sense amplifier 15.

The SRAM 10 is provided with a plurality of word lines (not shown) extending in the direction of rows of the memory cells 12 and word line drivers (not shown) for driving the word lines.

The SRAM 10 is further provided with a timing control circuit 17 and a precharge/equalization control circuit 18. The precharge/equalization control circuit 18 is arranged on the opposite side of the memory cell array 11 from the timing control circuit 17 and/or the sense amplifier 15.

The timing control circuit 17 receives input signals, such as a clock signal CK, an address signal AD, and a control signal CNT, and controls the timing for accessing the memory cells 12 based on the input signal. Specifically, the timing control circuit 17 generates a timing signal (e.g. a signal for selecting a word line or a signal for activating the sense amplifier 15).

The precharge/equalization control circuit 18 has a logic circuit and generates a precharge/equalization signal EQ according to the logic level of the timing signal provided by the timing control circuit 17. The precharge/equalization control circuit 18 provides the precharge/equalization signal EQ to each of the precharge/equalization circuits 14 (14U, 14M and 14L). The precharge/equalization signal EQ is firstly transmitted to the upper precharge/equalization circuit 14U located far from the timing control circuit 17 to sequentially activate the precharge/equalization circuits 14U, 14M, and 14L.

Figure 4:
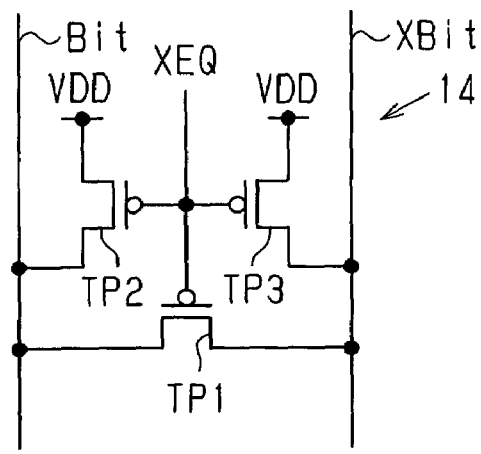
FIG. 4 is a circuit diagram showing a precharge/equalization circuit included in the SRAM of FIG. 3.

FIG. 4 is a circuit diagram of the precharge/equalization circuit 14.

The precharge/equalization circuit 14 has three p-channel MOS transistors TP1, TP2, and TP3. In the precharge/equalization circuit 14, the p-channel MOS transistor TP1 corresponds to an equalization circuit, and the p-channel MOS transistors TP2 and TP3 correspond to precharge circuits.

Specifically, the source and drain of the p-channel MOS transistor TP1 are connected to the bit lines Bit and XBit, respectively. The gate of the p-channel MOS transistor TP1 is provided with a control signal XEQ having a logic level opposite to that of the precharge/equalization signal EQ. The drain of the p-channel MOS transistor TP2 is connected to the bit line Bit. The drain of the p-channel MOS transistor TP3 is connected to the bit line XBit. The sources of the p-channel MOS transistors TP2 and TP3 are supplied with a high-potential power supply voltage VDD. The gates of the p-channel MOS transistors TP2 and TP3 are provided with the control signal XEQ.

Accordingly, when the precharge/equalization signal EQ is high (H) (i.e., the control signal XEQ is low (L)), the three p-channel MOS transistors TP1, TP2 and TP3 are activated. The activated p-channel MOS transistor TP1 short-circuits the bit line Bit with the bit line XBit. The activated p-channel MOS transistor TP2 supplies the high potential supply voltage VDD to the bit line Bit. The activated p-channel MOS transistor TP3 supplies the high potential supply voltage VDD to the bit line XBit. In this manner, the bit lines Bit and XBit are precharged to the supply voltage VDD.

The operation of the SRAM 10 will now be described. The operation for reading data from the memory cell 12U that is farthest position from the sense amplifier 15 (the memory cell under the worst condition in terms of timing) will be described.

Figure 5:
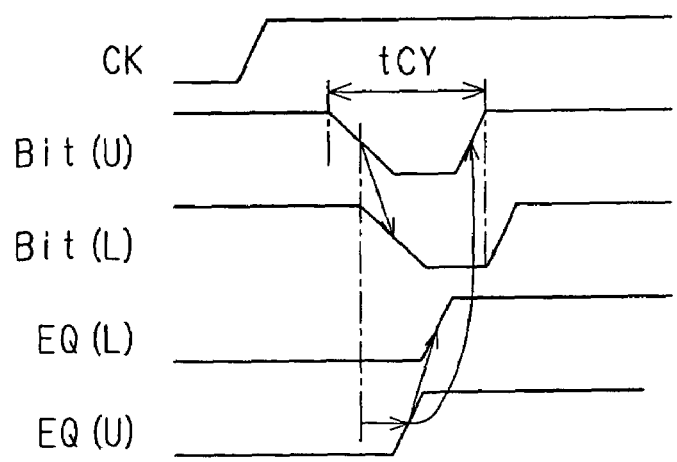
FIG. 5 is an operational waveform chart of the SRAM of FIG. 3.

As shown in FIG. 5, the read operation is started when a clock signal CK is input to the timing control circuit 17. The timing control circuit 17 provides a timing signal to the precharge/equalization control circuit 18. Further, the word line driver (not shown) drives the word line (not shown) connected to the memory cell 12U so that the data of the memory cell 12U is output on the bit line Bit. The output data is transmitted to the sense amplifier 15 via the upper portion (U), the middle portion (M), and the lower portion (L) of the bit line Bit. The sense amplifier 15 amplifies the data transmitted to the lower portion (L) of the bit line Bit to read the amplified data.

When a predetermined delay time elapses after receiving the timing signal from the timing control circuit 17, the precharge/equalization control circuit 18 outputs a high precharge/equalization signal EQ. The precharge/equalization signal EQ is transmitted to the precharge/equalization circuits 14 sequentially from the upper precharge/equalization circuit 14U to the lower precharge/equalization circuit 14L. The above-mentioned delay time is set such that the timing at which the precharge/equalization signal EQ reaches the lower precharge/equalization circuit 14L is later than the timing at which the potential at the lower portion (L) of the bit line Bit drops to a low potential level enabling the reading of data (e.g., the timing at which sense amplifier 15 is activated in response to a sense amplifier activation signal).

Figure 1:
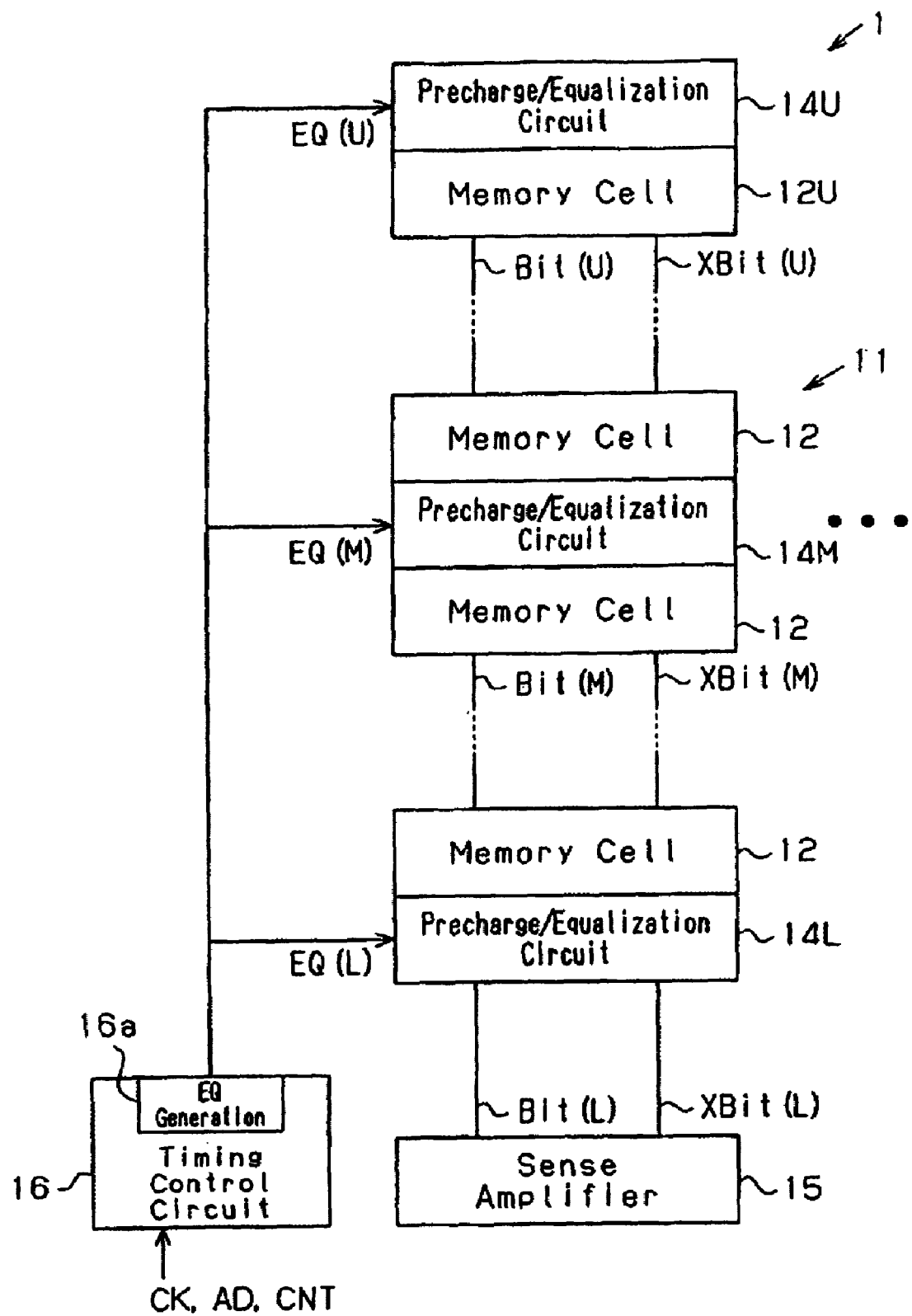
FIG. 1 is a schematic block diagram showing a conventional semiconductor memory device.
Figure 2:
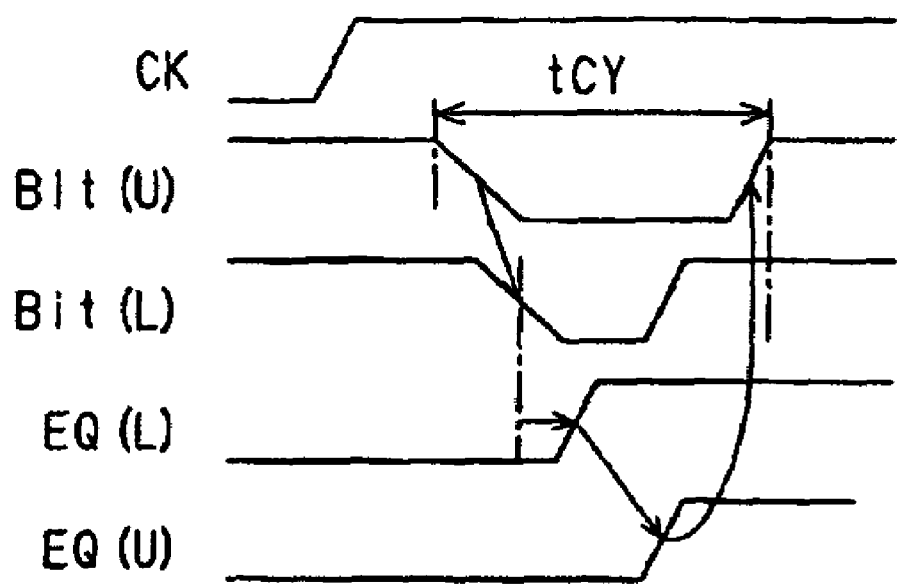
FIG. 2 is an operational waveform chart of the semiconductor memory device of FIG. 1.

In the SRAM 10 of the first embodiment, the output timing of a precharge/equalization signal EQ is earlier than the output timing of the conventional semiconductor memory device 1 shown in FIGS. 1 and 2 by the time from when the precharge/equalization signal EQ is transmitted to the upper precharge/equalization circuit 14U to the time when the precharge/equalization signal EQ is transmitted to the lower precharge/equalization circuit 14L. The order of the output timing of the precharge/equalization signal EQ and the timing at which the potential at the lower portion (L) of the bit line Bit drops to a low level enabling the reading of data varies in accordance with the setting of the delay time.

In response to the precharge/equalization signal EQ, the precharge/equalization circuits 14 precharge the bit line pair Bit/ XBit sequentially from the upper portion (the portion that is far from the timing control circuit 17 and/or the sense amplifier 15) to the lower portion (the portion that is close to the timing control circuit 17 and/or the sense amplifier 15). In other words, the upper portion of the bit line pair Bit/XBit is precharged first, and the lower portion of the bit line pair Bit/XBit is precharged later. Since the precharging is carried out in this manner in the SRAM 10 of the first embodiment, the precharge operation is completed faster than the conventional semiconductor memory device 1 illustrated in FIGS. 1 and 2. As a result, the cycle time tCY of the read operation is shortened.

During the write operation, in the same manner as in the read operation, the precharge/equalization signal EQ is transmitted sequentially from the upper precharge/equalization circuit 14U to the lower precharge/equalization circuit 14L. The precharge/equalization circuits 14 first completes the precharging of the upper portion of the bit line Bit and then completes the precharging of the lower portions of the bit line Bit. As a result, the cycle time of the write operation is shortened.

The SRAM 10 of the first embodiment has the advantage described below.

The precharge/equalization control circuit 18 is arranged on the opposite side of the memory cell array 11 from the timing control circuit 17 and/or the sense amplifier 15. With such an arrangement, the precharge/equalization signal EQ output from the precharge/equalization control circuit 18 is transmitted to the recharge/equalization circuits 14 sequentially from the precharge/equalization circuit 14U that is far from the timing control circuit 17 to the precharge/equalization circuit 14L that is close to the timing control circuit 17. Therefore, the precharge/equalization circuits 14 complete the precharge of the upper portion of the bit lines Bit and XBit before completing the precharge of the lower portion of the bit lines Bit and XBit. This shortens the cycle time of the read operation.

(Second Embodiment)

An SRAM 20 according a second embodiment of the present invention will now be described with reference to FIG. 6.

Figure 6:
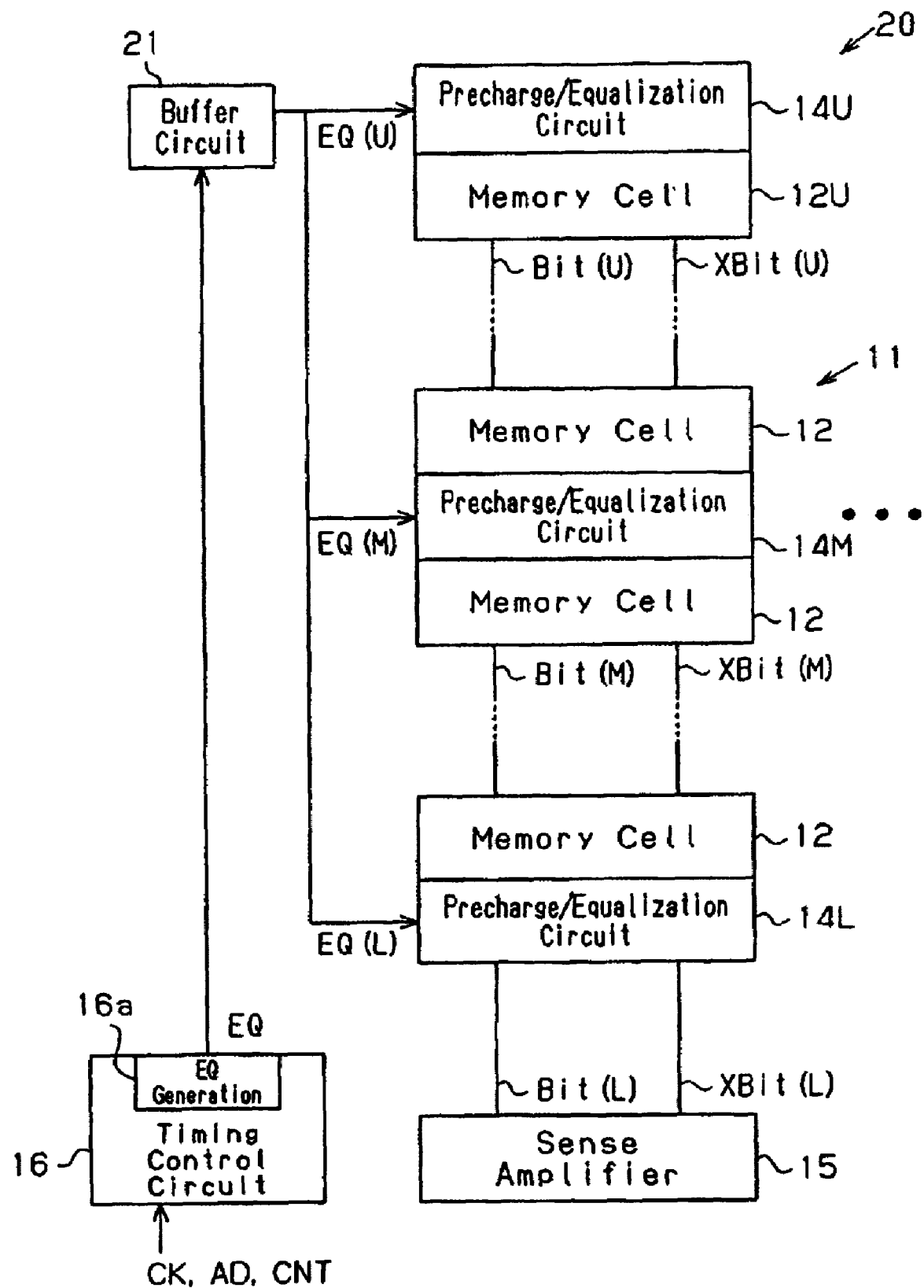
FIG. 6 is a schematic block diagram showing an SRAM according to a second embodiment of the present invention.

As shown in FIG. 6, in the same manner as the conventional semiconductor memory device 1 of FIG. 1, the SRAM 20 of the second embodiment has a timing control circuit 16 including a precharge/equalization control circuit 16a, which generates a precharge/equalization signal EQ. Unlike the semiconductor memory device 1 of FIG. 1, however, the SRAM 20 of the second embodiment has a buffer circuit 21, which transfers the precharge/equalization signal EQ generated by the precharge/equalization control circuit 16a, to precharge/equalization circuits 14U, 14M, and 14L.

More specifically, the buffer circuit 21 is arranged on the opposite side of the memory cell array 11 from the timing control circuit 16 and/or the sense amplifier 15. A precharge/equalization signal EQ output by the buffer circuit 21 is transmitted to the precharge/equalization circuits 14 sequentially from the precharge/equalization circuit 14U that is far from the timing control circuit 16 and to the precharge/equalization circuit 14L that is close to the timing control circuit 16. The respective precharge/equalization circuits 14U, 14M and 14L precharge the bit lines Bit and XBit in response to the precharge/equalization signal EQ.

In the same manner as the SRAM 10 of the first embodiment, in the SRAM 20 of the second embodiment, the precharge of the upper portion of the bit line pair Bit/XBit is completed first and the precharge of the lower portions is completed later. Thus, the cycle time tCY of the read operation is shortened.

Practically, the SRAM 20 may be configured simply by arranging the buffer circuit 21 on the opposite side from the sense amplifier 15 in the semiconductor memory device 1 of FIG. 1. This decreases layout changes when designing the SRAM 20. Thus, the SRAM 20 is desirable from a practical viewpoint.

(Third Embodiment)

An SRAM 30 according to a third embodiment of the present invention will now be described with reference to FIG. 7.

Figure 7:
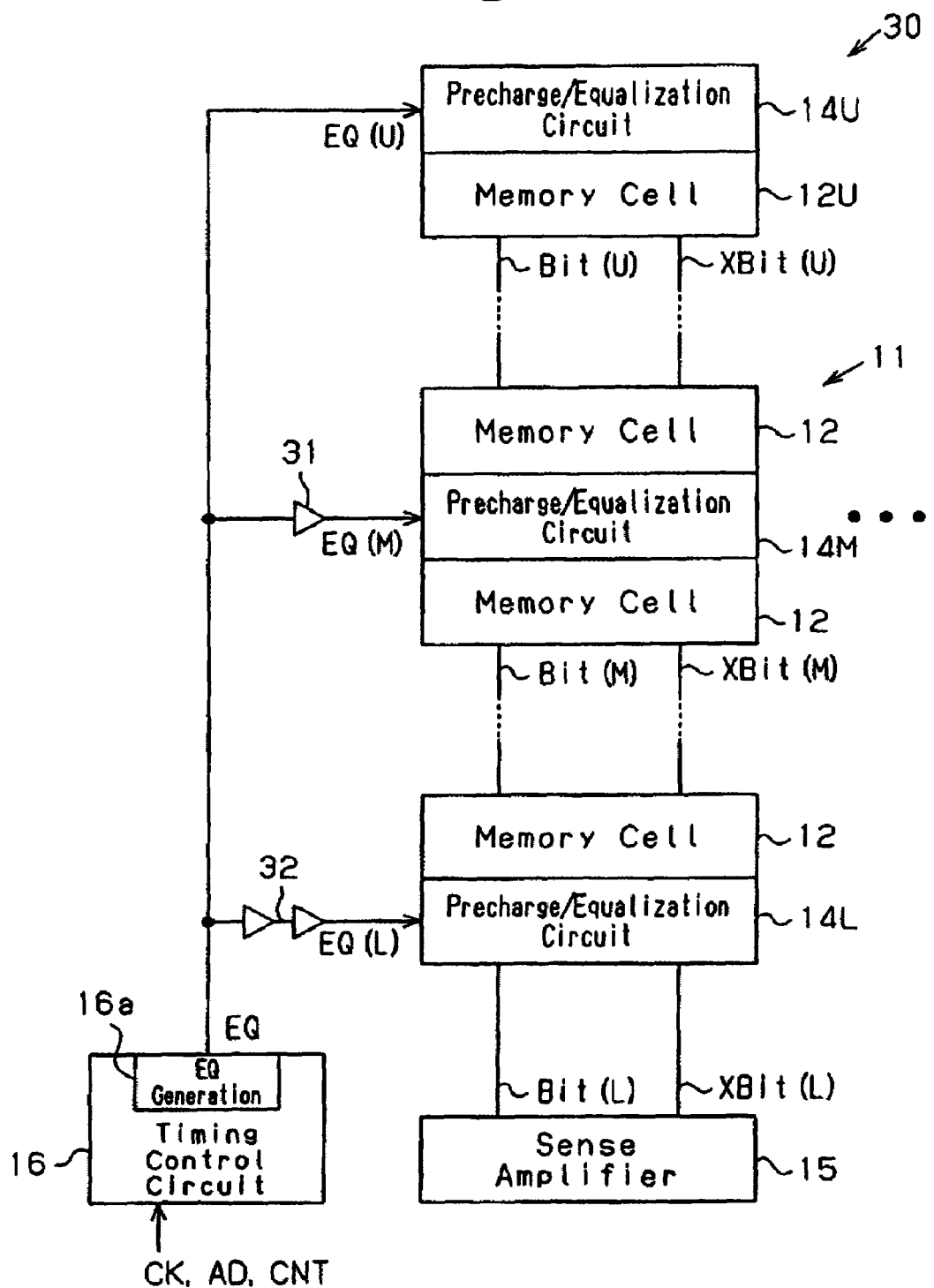
FIG. 7 a schematic block diagram showing an SRAM according to a third embodiment of the present invention.

As shown in FIG. 7, in the same manner as the semiconductor memory device 1 of FIG. 1, in the SRAM 30 of the third embodiment, a timing control circuit 16 includes a precharge/equalization control circuit 16a, which generates a precharge/equalization signal EQ. In the SRAM 30, a delay circuit 31 is connected between the precharge/equalization control circuit 16a and a middle precharge/equalization circuit 14M, and a delay circuit 32 is connected between the precharge/equalization control circuit 16a and a lower precharge/equalization circuit 14L.

A precharge/equalization signal EQ generated by the precharge/equalization control circuit 16a is provided directly to the upper precharge/equalization circuit 14U. Additionally, the precharge/equalization signal EQ is provided to the middle precharge/equalization circuit 14M via the delay circuit 31. Further, the precharge/equalization signal EQ is provided to the lower precharge/equalization circuit 14L via the delay circuit 32.

In the SRAM 30 of the third embodiment, the delay time of the delay circuit 32 is twice the delay time of the delay circuit 31. Accordingly, precharge/equalization circuits 14 located farther from the timing control circuit 16 receive the precharge/equalization signal EQ earlier than precharge/equalization circuits 14 located closer to the timing control circuit 16.

With such a configuration, the precharge/equalization circuits 14 are activated sequentially in order from the precharge/equalization circuit 14U that is farther from the timing control circuit 16. Therefore, in the same manner as the above embodiments, the precharge of the upper portion of the bit line pair Bit/XBit is completed first and the precharge of the lower portions is completed later. This shortens the cycle time tCY of the read operation.

(Fourth Embodiment)

An SRAM 40 according to a fourth embodiment of the present invention will now be described with reference to FIG. 8.

Figure 8:
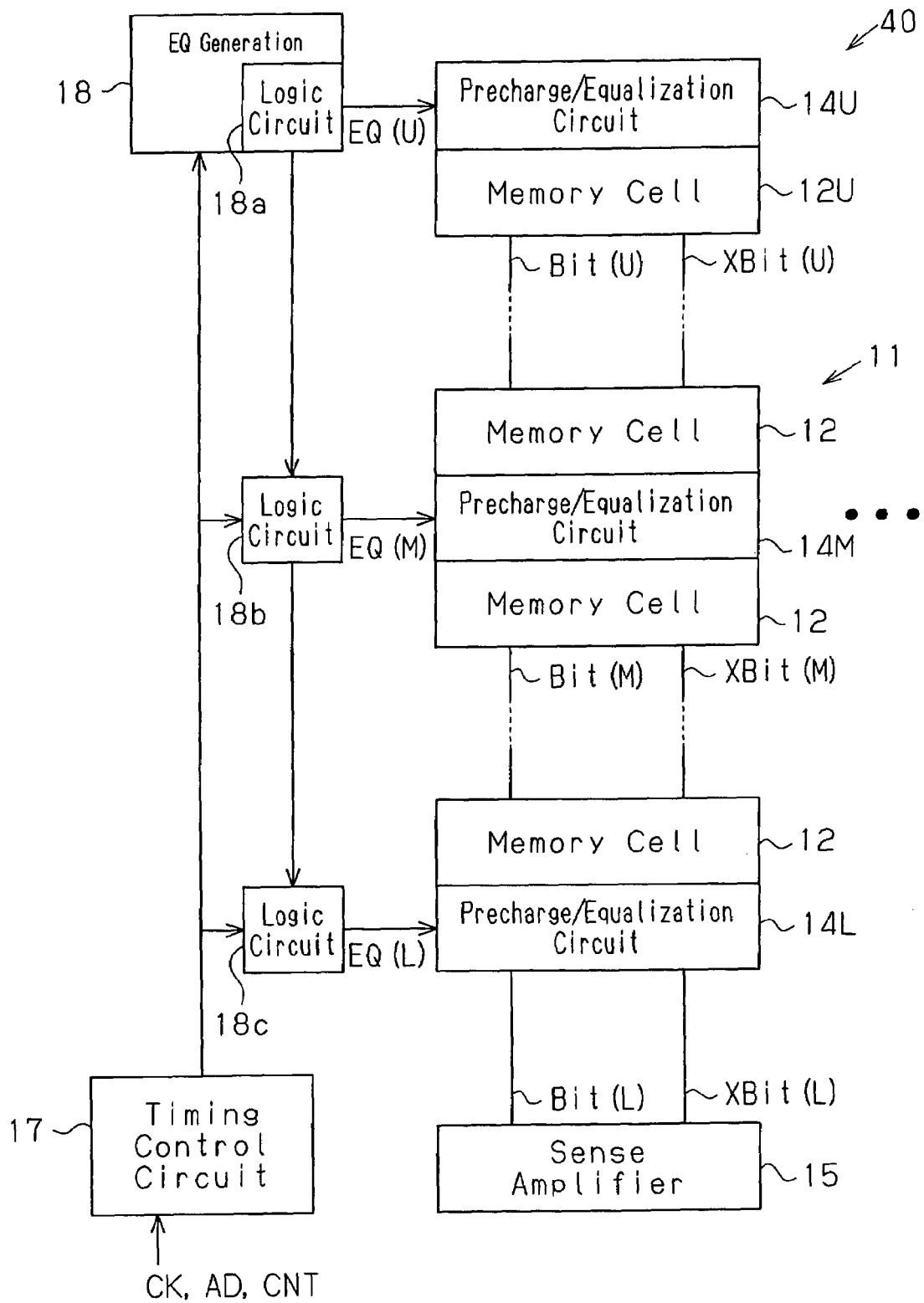
FIG. 8 is a schematic block diagram showing an SRAM according to a fourth embodiment of the present invention.

As shown in FIG. 8, in the same manner as the first embodiment, the SRAM 40 of the fourth embodiment has a timing control circuit 17 and a precharge/equalization control circuit 18 that are separate from each other. The precharge/equalization control circuit 18 is arranged on the opposite side of a memory cell array 11 from the timing control circuit 17 and/or a sense amplifier 15.

The precharge/equalization control circuit 18 includes a logic circuit 18a. Further, logic circuits 18b and 18c similar to the logic circuit 18a are provided in association with middle and lower precharge/equalization circuits 14M and 14L, respectively. The logic circuits 18a, 18b, and 18c are connected to each other.

The logic circuit 18a in the precharge/equalization control circuit 18 generates a precharge/equalization signal EQ in response to a timing signal provided by the timing control circuit 17 and provides the generated precharge/equalization signal EQ to the upper precharge/equalization circuit 14U. At the same time as when providing the precharge/equalization signal EQ, the logic circuit 18a also provides an enabling signal to the middle logic circuit 18b. The logic circuit 18b provides a precharge/equalization signal EQ to the precharge/equalization circuit 14M when receiving a timing signal from the timing control circuit 17 and an enabling signal from the logic circuit 18a. At the same time as when providing the precharge/equalization signal EQ, the logic circuit 18b provides an enabling signal to the lower logic circuit 18c. The logic circuit 18c provides a precharge/equalization signal EQ to the lower precharge/equalization circuit 14L when receiving a timing signal from the timing control circuit 17 and an enabling signal from the logic circuit 18b.

In the SRAM 40, the precharge/equalization signal EQ is transmitted to the precharge/equalization circuits 14 sequentially from the precharge/equalization circuit 14U that is far from the sense amplifier 15 to the precharge/equalization circuit 14L that is close to the sense amplifier 15. Accordingly, in the same manner as in the above embodiments, the precharge of the upper portion of the bit line pair Bit/XBit is completed first and the precharge of the lowers portions is completed later. Thus, the cycle time tCY for read operation is shortened.

(Fifth Embodiment)

An SRAM 50 according to a fifth embodiment of the present invention will be now be described with reference to FIG. 9.

Figure 9:
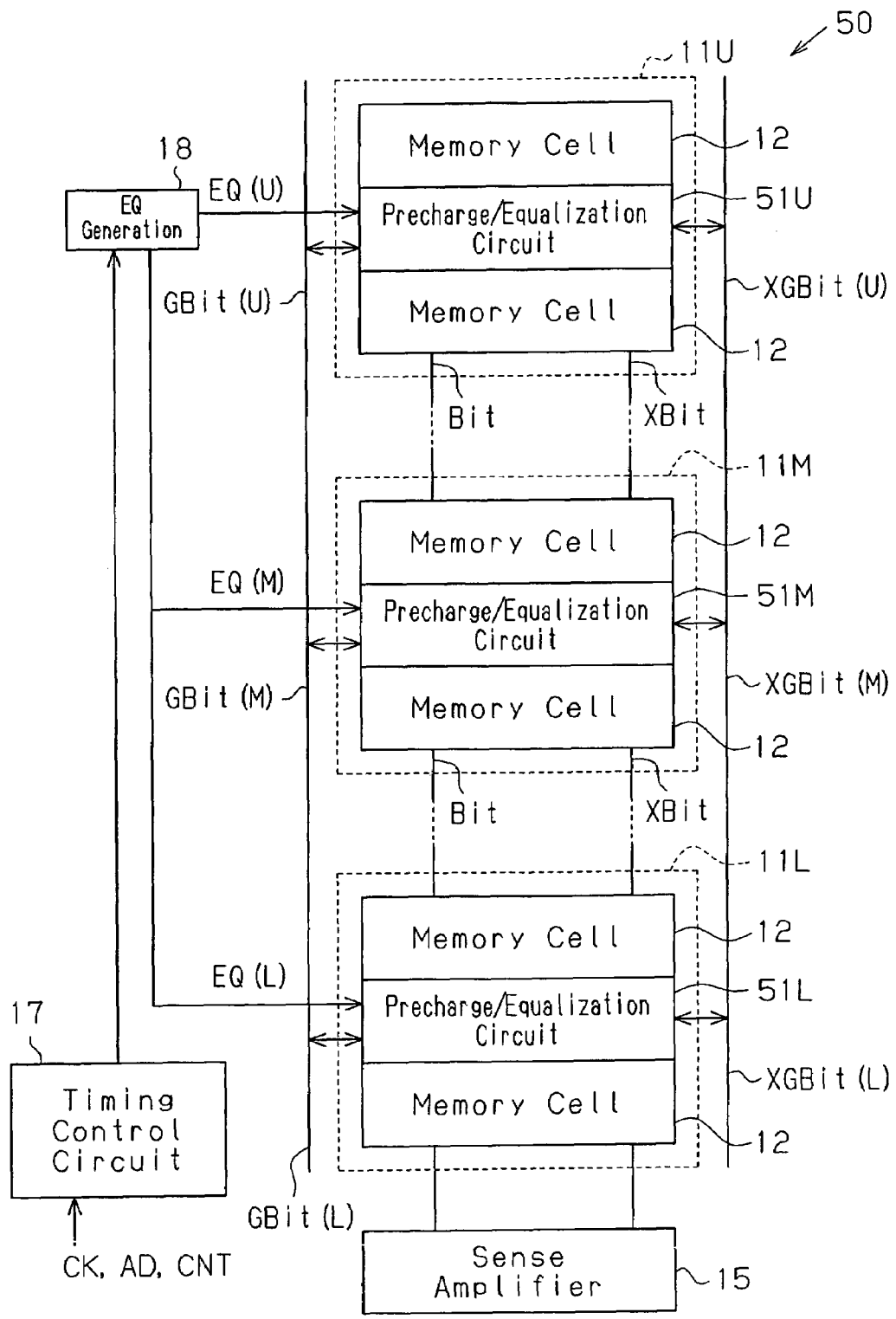
FIG. 9 is a schematic block diagram showing an SRAM according to a fifth embodiment of the present invention.

As shown in FIG. 9, in the SRAM 50 of the fifth embodiment, a memory cell array 11 is divided into a plurality of blocks 11U, 11M and 11L, Also, bit lines (local bit lines) Bit and XBit connected to memory cells 12 are divided into a plurality of regions along the direction of columns. Further, in the SRAM 50, global bit lines (common bit lines) GBit and XGBit for acquiring data output to the local bit lines Bit and XBit are provided in parallel with the local bit lines Bit and XBit to connect the blocks 11U, 11M, and 11L to each other. In other words, the SRAM 50 of the fifth embodiment is a memory using a hierarchical bit-line architecture so that the operation speed is increased and the power consumption is decreased.

The local bit lines Bit and XBit correspond to the bit lines Bit and XBit of the first embodiment, respectively. Precharge/equalization circuits (not shown) and a sense amplifier 15, similar to those in the first embodiment, are provided in association with the bit lines Bit and XBit.

The blocks 11U, 11M and 11L in the SRAM 50 are provided with the precharge/equalization circuits 51 (51U, 51M and 51L), respectively, for precharging the global bit lines GBit and XGBit. In the same manner as the first embodiment, the SRAM 50 of this embodiment is provided with a precharge/equalization control circuit 18, which generates a precharge/equalization signal EQ. The precharge/equalization control circuit 18 is arranged on the opposite side of the memory cell array 11 from the timing control circuit 17.

In the SRAM 50 configured in this manner, a precharge/equalization signal EQ output by the precharge/equalization control circuit 18 is transmitted sequentially from the precharge/equalization circuit 51U that is far from the timing control circuit 17 to the precharge/equalization circuit 51L that is close to the timing control circuit 17. The precharge/equalization circuit 51U, 51M, and 51L precharge the global bit lines GBit and XGBit in response to the precharge/equalization signal EQ.

In the SRAM 50 of the fifth embodiment, the precharge of the upper portion of the global bit lines GBit and XGBit is completed first and the lower portions are completed later by the respective precharge/equalization circuits 51U, 51M and 51L. Thus, the cycle time tCY of the read operation is shortened.

It should be apparent to those skilled in the art that the present invention may be embodied in many other specific forms without departing from the spirit or scope of the invention. Particularly, it should be understood that the present invention may be embodied in the following forms.

In the SRAMs 10 and 50 of the first and fifth embodiments, the precharge/equalization control circuit 18 is arranged on the opposite side of the memory cell array 11 from the timing control circuit 17. However, the arrangement of the precharge/equalization control circuit 18 is not limited to such a layout. It is only required that the precharge/equalization control circuit 18 be arranged farther from the timing control circuit 17 than the middle of the memory cell array 11. Further, in the second embodiment, the buffer circuit 21 may be arranged at a position farther from the timing control circuit 17 than the middle of the memory cell array 11. Such layouts also activate the precharge/equalization circuits sequentially from the precharge/equalization circuit 14U or 51U that is far from the timing control circuit 17.

In the embodiments described above, the precharge/equalization circuits 14 or 51 are provided respectively in three locations, namely the upper, middle, and lower portions in the memory cell array 11. However, the precharge/equalization circuits 14 or 51 may be provided at any number of locations. For example, the precharge/equalization circuits 14 or 51 may be provided in two locations or in four or more locations. Further, a plurality of the precharge/equalization control circuits 18 may be provided in correspondence with a plurality of the precharge/equalization circuits 14 or 51.

In the embodiments described above, the SRAM 10, 20, 30, 40, and 50 read data from the memory cells 12 through a pair of bit lines (bit line pair Bit/XBit). However, data may be read from a memory cell with a single bit line.

In the embodiments described above, the present invention is embodied in the SRAMs 10, 20, 30, 40 and 50, which function as a semiconductor device. However, the present invention may be embodied in bit-line precharging memories other than an SRAM, for example, in a DRAM.

The present examples and embodiments are to be considered as illustrative and not restrictive, and the invention is not to be limited to the details given herein, but may be modified within the scope and equivalence of the appended claims.

What is claimed is:

1. A semiconductor memory device comprising:
   a memory cell array including a plurality of memory cells;
   a bit line connected to the memory cells;
   a plurality of precharge circuits, connected to the bit line, for precharging the bit line to a predetermined potential;
   a timing control circuit for generating a timing signal to access each of the memory cells; and
   a precharge control circuit, connected to the timing control circuit and the precharge circuits, for controlling the plurality of precharge circuits in response to the timing signal such that the precharge circuits are sequentially activated from the one that is farthest from the timing control circuit to the one that is closest to the timing control circuit.

2. The semiconductor memory device according to claim 1, wherein the precharge control circuit is arranged on the opposite side of the memory cell array from the timing control circuit or at a location that is farther from the timing control circuit than a middle portion of the memory cell array.

3. The semiconductor memory device according to claim 1, wherein the precharge control circuit is arranged in the timing control circuit and provides the plurality of precharge circuits with a precharge signal that activates the precharge circuits, the semiconductor memory device further comprising:
   a buffer circuit, connected to the precharge control circuit and the precharge circuits, for transferring the precharge signal to the precharge circuits, the buffer circuit being arranged on the opposite side of the memory cell array from the timing control circuit or at a location farther from the timing control circuit than a middle portion of the memory cell array.

4. The semiconductor memory device according to claim 1, wherein the precharge control circuit is arranged in the timing control circuit and generates a precharge signal for activating the precharge circuits, the semiconductor memory device further comprising:
   a delay circuit, selectively connected between the precharge control circuit and the precharge circuits, for delaying the precharge signal.

5. The semiconductor memory device according to claim 4, wherein the precharge circuit farthest from the timing control circuit is connected to the precharge control circuit without the delay circuit connected therebetween, and the precharge circuit closest to the timing control circuit is connected to the precharge control circuit via the delay circuit.

6. The semiconductor memory device according to claim 1, wherein the precharge control circuit is arranged on the opposite side of the memory cell array from the timing control circuit, the semiconductor memory device further comprising:
a plurality of logic circuits, each connected to an associated one of the precharge circuits, for enabling activation of the associated precharge circuits.

7. The semiconductor memory device according to claim 6, wherein:
the logic circuits are series-connected with one another and connected to the timing control circuit;
the timing control circuit provides each of the logic circuits with the timing signal;
the precharge control circuit includes one of the logic circuits;
the logic circuit of the precharge control circuit, when receiving the timing signal, activates the corresponding precharge circuit and provides an adjacent one of the logic circuits with an enabling signal; and
the adjacent logic circuit activates the associated precharge circuit when receiving the timing signal and the enabling signal.

8. The semiconductor memory device according to claim 1, further comprising:
a sense amplifier, connected to the bit line, for reading data from the memory cells through the bit line, the sense amplifier being arranged on the same side of the memory cell array as the timing control circuit.

9. The semiconductor memory device according to claim 8, wherein the precharge control circuit generates a precharge signal for activating the precharge circuits when a predetermined time elapses after receiving the timing signal, the predetermined time being set such that the precharge signal reaches the precharge circuit closest to the timing control circuit after the sense amplifier reads data from the memory cells.

10. A semiconductor memory device comprising:
a memory cell array having a plurality of blocks, each including a plurality of memory cells;
a local bit line connected to the memory cells in each of the blocks;
a global bit line connected to the blocks;
a plurality of precharge circuits, connected to the global bit line, for precharging the global bit line to a predetermined potential;
a timing control circuit for generating a timing signal to access each of the memory cells; and
a precharge control circuit, connected to the timing control circuit and the precharge circuits, for controlling the precharge circuits in response to the timing signal such that the precharge circuits are sequentially activated from the one that is farthest from the timing control circuit to the one that is closest to the timing control circuit.

11. A semiconductor memory device comprising:
a memory cell array including a plurality of memory cells, each storing data;
a bit line connected to the memory cells;
a sense amplifier, connected to the bit line, for reading data from each of the memory cells through the bit line;
a plurality of precharge circuits, connected to the bit line, for precharging the bit line to a predetermined potential; and
a precharge control circuit, connected to the precharge circuits, for controlling the precharge circuits such that the precharge circuits are sequentially activated from the one that is farthest from the sense amplifier to the one that is closest to the sense amplifier.

12. A method for precharging a bit line connected to a plurality of memory cells in a semiconductor memory device, the semiconductor memory device including a timing control circuit and a plurality of precharge circuits, connected to the bit line, for precharging the bit line to a predetermined potential, the method comprising:
generating a timing signal for accessing each of the memory cells with the timing control circuit; and
controlling the precharge circuits in response to the timing signal such that the precharge circuits are sequentially activated from the one that is farthest from the timing control circuit to the one that is closest to the timing control circuit.

13. A method for precharging a bit line connected to a plurality of memory cells in a semiconductor memory device, the semiconductor memory device including a plurality of precharge circuits, connected to the bit line, for precharging the bit line to a predetermined potential and a sense amplifier, connected to the bit line, for reading data from each of the memory cells through the bit line, the method comprising:
generating a timing signal for accessing each of the memory cells; and
controlling the precharge circuits in response to the timing signal such that the precharge circuits are activated sequentially from the one that is farthest from the sense amplifier to the one that is closest to the sense amplifier.

14. A method for precharging a bit line connected to a memory cell in a semiconductor memory device, the semiconductor memory device including a plurality of precharge circuits, connected to the bit line, for precharging the bit line to a predetermined potential and a sense amplifier, connected to the bit line, for reading data from the memory cell through the bit line, the method comprising:
generating a timing signal for accessing each of the memory cells;
starting reading of data from the memory cell with the sense amplifier;
receiving a timing signal;
generating a precharge signal for activating the precharge circuits when a predetermined time elapses after receiving the timing signal; and
transmitting the precharge signal to the precharge circuits sequentially from the one farthest from the sense amplifier to the one closest to the sense amplifier,
wherein the predetermined time is set such that the precharge signal reaches the precharge circuit closest to the sense amplifier after the completion of reading data from the memory cell.

* * * * *